(12) United States Patent
Greer et al.

(10) Patent No.: US 9,312,137 B2
(45) Date of Patent: Apr. 12, 2016

(54) REDUCTION OF NATIVE OXIDES BY ANNEALING IN REDUCING GAS OR PLASMA

(71) Applicant: Intermolecular Inc., San Jose, CA (US)

(72) Inventors: Frank Greer, Pasadena, CA (US); Amol Joshi, Sunnyvale, CA (US); Kevin Kashefi, San Jose, CA (US); Albert Sanghyup Lee, Cupertino, CA (US); Abhijit Pethe, San Jose, CA (US); J Watanabe, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 426 days.

(21) Appl. No.: 14/068,906

(22) Filed: Oct. 31, 2013

(65) Prior Publication Data

US 2015/0118828 A1 Apr. 30, 2015

(51) Int. Cl.
*H01L 21/00* (2006.01)
*H01L 21/28* (2006.01)
*H01L 21/02* (2006.01)
*C23C 16/02* (2006.01)
*C23C 16/455* (2006.01)

(52) U.S. Cl.
CPC ...... *H01L 21/28158* (2013.01); *C23C 16/0218* (2013.01); *C23C 16/45525* (2013.01); *H01L 21/0228* (2013.01); *H01L 21/02175* (2013.01)

(58) Field of Classification Search
CPC .................. H01L 21/28158; H01L 21/02175; H01L 21/0228
See application file for complete search history.

(56) References Cited

U.S. PATENT DOCUMENTS

| | | | |
|---|---|---|---|
| 6,232,194 B1 | 5/2001 | Yaung | |
| 6,764,951 B1 | 7/2004 | Van Ngo | |
| 6,911,707 B2 | 6/2005 | Gardner | |
| 6,946,368 B1* | 9/2005 | Vandroux | H01L 21/3003 257/E21.212 |
| 7,202,166 B2* | 4/2007 | Wilk | C23C 16/0245 257/E21.171 |
| 7,297,608 B1 | 11/2007 | Papasouliotis | |
| 7,521,379 B2 | 4/2009 | Khandelwal | |
| 7,704,896 B2* | 4/2010 | Haukka | C23C 16/0272 257/E21.274 |
| 8,901,677 B2* | 12/2014 | Greer | H01L 21/31122 257/410 |
| 8,993,440 B2* | 3/2015 | Masuda | H01L 21/02074 257/632 |
| 2010/0311240 A1* | 12/2010 | Masuda | H01L 21/02074 438/674 |
| 2013/0309866 A1* | 11/2013 | Masuda | H01L 21/02074 438/674 |
| 2014/0175618 A1* | 6/2014 | Mujumdar | H01L 21/02175 257/644 |
| 2014/0252565 A1* | 9/2014 | Greer | H01L 21/31122 257/635 |
| 2015/0118828 A1* | 4/2015 | Greer | H01L 21/02175 438/476 |

* cited by examiner

*Primary Examiner* — Laura Menz

(57) ABSTRACT

Native oxide growth on germanium, silicon germanium, and InGaAs undesirably affects CET (capacitive equivalent thickness) and EOT (effective oxide thickness) of high-k and low-k metal-oxide layers formed on these semiconductors. Even if pre-existing native oxide is initially removed from the bare semiconductor surface, some metal oxide layers are oxygen-permeable in thicknesses below about 25 Å thick. Oxygen-containing species used in the metal-oxide deposition process may diffuse through these permeable layers, react with the underlying semiconductor, and re-grow the native oxide. To eliminate or mitigate this re-growth, the substrate is exposed to a gas or plasma reductant (e.g., containing hydrogen). The reductant diffuses through the permeable layers to react with the re-grown native oxide, detaching the oxygen and leaving the un-oxidized semiconductor. The reduction product(s) resulting from the reaction may then be removed from the substrate (e.g., driven off by heat).

20 Claims, 4 Drawing Sheets

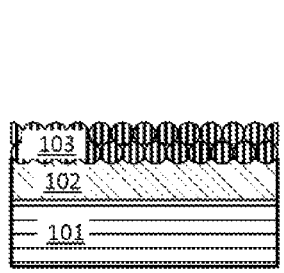
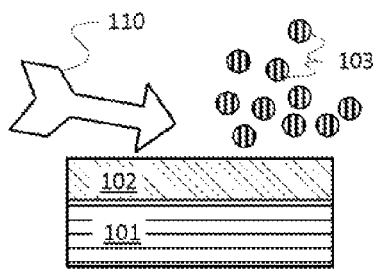
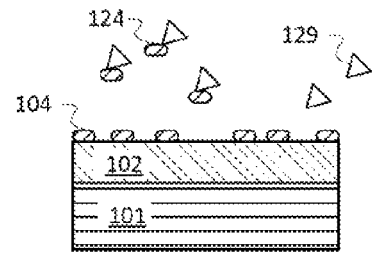
*FIG. 1A*  *FIG. 1B*  *FIG. 1C*
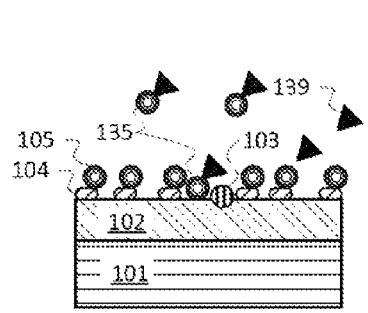
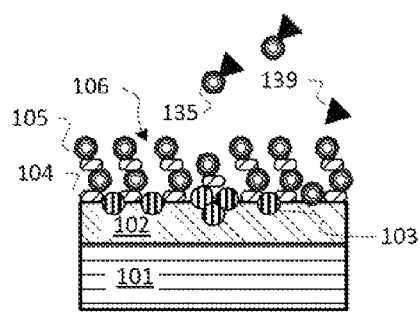
*FIG. 1D*  *FIG. 1E*
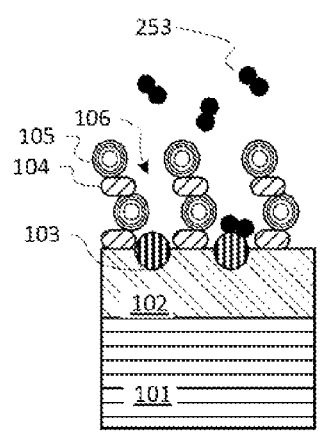
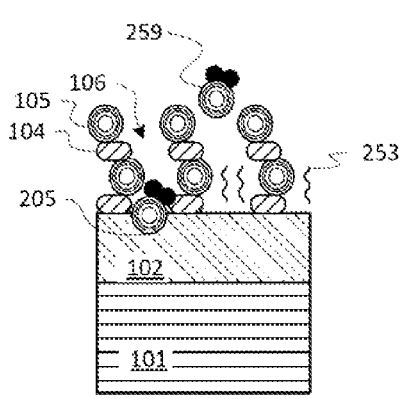
*FIG. 2A*  *FIG. 2B*

US 9,312,137 B2

REDUCTION OF NATIVE OXIDES BY ANNEALING IN REDUCING GAS OR PLASMA

BACKGROUND

Related fields include atomic layer deposition, high-performance logic, and mitigation of native-oxide effects on semiconductor device performance.

Traditional device scaling of logic devices based on silicon (Si) has encountered obstacles. Inherent material properties have placed limitations on further miniaturization, increases in processing speed, and other performance enhancements. For example, as gate conductor width decreases, gate dielectric thickness also needs to decrease to provide sufficient capacitance to control the transistor. Suppression of leakage current is critical to performance of a capacitor dielectric. Silicon oxide layers <2 nm thick are subject to unacceptably high leakage current due to tunneling effects.

Tunneling leakage decreases as a function of physical thickness. Therefore, there has been interest in gate dielectric materials that would exhibit the same capacitance as 1-2 nm thick silicon dioxide ($SiO_2$) at a physical thickness too large for significant tunneling leakage (e.g., >=5 nm). Metal oxides with high dielectric constants ("high-k materials") such as hafnium oxide ($HfO_x$), aluminum oxide ($Al_2O_3$), and zirconium oxide ($ZrO_x$) are, among others, being investigated as gate-dielectric candidates to replace silicon oxide.

Another avenue of exploration is replacement of Si channels with higher-mobility, lower-effective-mass materials such as germanium (Ge). Ge and Si—Ge are being explored for surface channels and strained buried channels. Indium gallium arsenide (InGaAs) is another Si substitute under consideration. The new materials, however, face various integration challenges. Several of these challenges are rooted in the susceptibility of these materials to growth of unstable native oxides that increase operational power consumption and decrease reliability.

Uncontrolled native oxide growth under a capacitor dielectric can unpredictably affect the effective oxide thickness ($EOT=(k_{SiO2}/k)t$) and the capacitive effective thickness ($CET\sim EOT+(k_{SiO2}/k)z_{avg}$ for an ultra-thin gate dielectric) of a logic stack. In the equations, k=dielectric constant of the actual material, t=physical thickness of the actual material, $Z_{avg}$=average distance of inversion carriers from the gate-dielectric interface, and $k_{SiO2}$=dielectric constant of $SiO_2\sim3.9$.

Removing the native oxide from Ge immediately before atomic layer deposition (ALD) of a high-k metal oxide layer has proven to be an incomplete solution. Although the ambient air that often triggers native $GeO_x$ growth is excluded from the ALD process chamber, the oxygen precursors (e.g., $H_2O$) used for the high-k layer deposition can encourage the native $GeO_x$ to regrow. Some of the high-k materials, such as $Al_2O_3$ and $HfO_x$, are permeable in thicknesses less than about 25 angstroms (Å). Unbonded oxygen or oxidant molecules can diffuse through the high-k layers and grow native $GeO_x$ underneath them even after they are partially (or, in some cases, fully) deposited.

Therefore, advanced logic technology would benefit if the unwanted dielectric effects of unstable native-oxide growth in materials such as Ge and InGaAs could be mitigated. In particular, a treatment that could work through permeable overlying layers would be desirable.

SUMMARY

The following summary presents some concepts in a simplified form as an introduction to the detailed description that follows. It does not necessarily identify key or critical elements and is not intended to reflect a scope of invention.

The oxidation reaction that creates unstable native oxides on Ge (and other semiconductors such as InGaAs) is countered by a reduction reaction of the native oxide with a reductant such as hydrogen. Like the oxygen-containing precursors that pass through permeable overlayers to react with the underlying semiconductor, reductants such as hydrogen-containing precursors or active species pass through the permeable overlayers to react with the underlying native oxide. The reductant detaches an oxygen component from the native oxide to form a reduction product. When the reduction products are removed, a non-oxidized semiconductor surface is left behind.

"Permeable," as used herein, means at least permeable to oxygen and to the reductant used in the process. For some embodiments, it may also mean permeable to oxygen-containing compounds, gases, or species exposed to the substrate during various fabrication processes, and to any reduction products produced by the reaction of the reductant with the native oxide.

Some methods to take advantage of this reduction effect include hydrogen ($H_2$) plasma treatments. Some methods include soaks in $H_2$ or ammonia ($NH_3$). The reductant (e.g., the $NH_3$ or $H_2$) diffuses through the permeable layers (e.g., metal oxides such as $HfO_x$ or $Al_2O_3$) to reduce the $GeO_x$ underneath, reducing the CET and EOT of the stack. As used in the ALD art, a "soak" may include introducing a gas in the chamber, then closing off the inlets and exhausts for a predetermined time while the gas adsorbs or reacts with the substrate surface. It may also be done as a very long pulse (for instance, about 30 seconds to about 10 minutes). During this type of soak, the gas inflow and outflow may be adjusted to keep the pressure in the chamber approximately (e.g., ±10%) constant.

The reduction treatment may be repeated at intervals during the formation of the permeable layers. Alternatively, it may be done just before the formation of the first oxygen-impermeable layer (e.g., a titanium nitride (TiN) layer) above the native oxide. If the oxygen-impermeable layer is formed by ALD, the reduction treatment may be postponed until (or may be repeated after) the deposition of an initial few monolayers if the initial few monolayers are partially permeable.

In some embodiments of reduction treatments, the substrate is heated to about 300-400 C. Heating may promote the reaction or help to drive the reduction products off the surface through any overlying permeable layers. Chamber pressure may be between about 0.1 and about 5 Torr. Treatment duration may be between about 1 and about 60 minutes. In some embodiments, the reductant does not react with one or more of the permeable layers through which it diffuses before reaching the underlying semiconductor. The permeable layers may be between about 2 and about 40 Å thick. The permeable layers may have dielectric constants (k) above or below 9.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 1A-1E conceptually illustrate the removal of native oxide and its regrowth as permeable layers are formed over the host semiconductor in the presence of oxygen.

FIGS. 2A and 2B conceptually illustrate the effect of introducing a reductant through a permeable overlayer.

DETAILED DESCRIPTION OF EXAMPLE EMBODIMENTS

Figure 3:
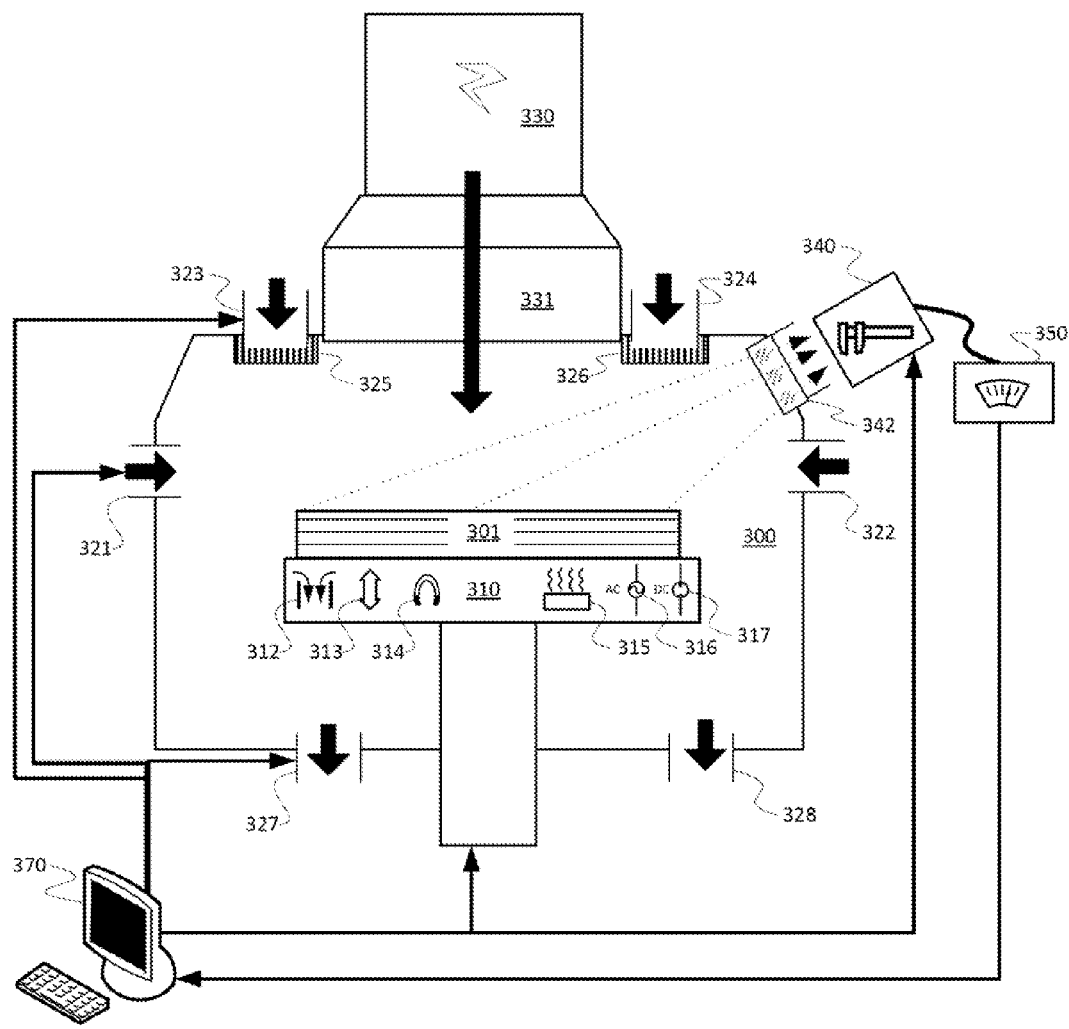
FIG. 3 is a schematic diagram of an example ALD chamber.

Semiconductor fabrication generally requires many other processes before and after those described. This description omits steps that are irrelevant to, or that may be performed independently of, the described processes. To avoid unnecessarily obscuring the description, some technical material known in the related fields is not described in detail.

By default, singular articles "a," "an," and "the" (or the absence of an article) may encompass plural variations. For example, "a layer" may mean "one or more layers," except where the text or context clearly indicates "only one layer." "About" or "approximately" contemplates up to 10% variation. "Substantially" contemplates up to 5% variation.

FIGS. 1A-1E conceptually illustrate the removal of native oxide and its regrowth as permeable layers are formed over the host semiconductor in the presence of oxygen. In FIG. 1A, substrate 101 has a top semiconductor layer 102. Substrate 101 may have any number of other layers under top semiconductor layer 102. Top semiconductor layer 102 has a native oxide 103 on its upper surface. Such native oxides 103 routinely grow on semiconductors such as silicon, germanium, or InGaAs when the semiconductors are exposed to the oxygen in ambient air, but they can also result from exposure to other sources of oxygen.

In FIG. 1B, a removal process 110 removes native oxide 103 from the top surface of semiconductor 102. A number of processes for this removal are known in the art, such as wet etches, polishing, laser ablation, plasma treatments, and others. Some of the processes may involve reducing agents. The methods described herein may be practical in some cases; for example, when the native oxide is initially thin.

In FIG. 1C, an ALD precursor 124 is introduced into a process chamber containing substrate 101. For example, precursor 124 may be a metal precursor. When precursor 124 encounters the upper surface of top semiconductor 102, deposited material 104 (e.g., the metal) is adsorbed onto the surface. As used herein, "adsorb" may include chemisorption, physisorption, electrostatic or magnetic attraction, or any other interaction resulting in part or all of the precursor adhering to the substrate surface. In some processes, the entire precursor molecule adsorbs to the surface. In other processes, a ligand 129 is initially part of precursor 124, but detaches from deposited material 104 when deposited material 104 adsorbs to the surface. Typically, detached ligands 129 and any unabsorbed precursor 124 are then purged from the chamber.

In FIG. 1D, an oxygen-containing precursor 135 is introduced in the chamber. The oxygen may be the deposited material 105, as illustrated, or it may be part of ligand 139. In some processes, the oxygen may not even be part of a precursor, but may be part of some other process gas such as a purge gas, buffer gas, or catalyst. Because the layer being deposited onto semiconductor 102 is permeable, some oxygen 105 may diffuse through pores or gaps in the permeable layer to reach and oxidize semiconductor 102. This reaction results in regrowth of native oxide 103. The chamber is purged again after this step, but a normal purge generally cannot remove the oxygen that has reacted with substrate 102.

In FIG. 1E, more ALD cycles have occurred. A new layer (e.g., a metal oxide) is being formed on semiconductor 102. Because the new layer is permeable, every cycle involving oxygen-containing precursor 135 presents an opportunity for oxygen to diffuse through pores or gaps 106 to the underlying semiconductor 102, where it reacts to form more native oxide 103. Both high-k and low-k metal oxides can be permeable after deposition, especially when the layers are thin (<50 Å). While the growth of the ALD layer is tightly controlled, the incidental regrowth of native oxide 103 is uncontrolled and unpredictable. If the layer being grown is a dielectric for a capacitor, the regrown native oxide 103 decreases the dielectric constant k of the dielectric layer ($GeO_2$ is very low-k), and increases the CET and EOT of the finished device, as an uncontrolled variable.

FIGS. 2A and 2B conceptually illustrate the effect of introducing a reductant through a permeable overlayer. In FIG. 2A, a layer including material components 104 and 105 has been formed on semiconductor layer 102 on substrate 101. The layer is permeable. Regrown native oxide 103 has resulted from oxygen percolating through pores or gaps 106. A reductant 253 is introduced into the chamber and allowed to diffuse through gaps 106 to reach and react with regrown native oxide 103.

In FIG. 2B, reductant 253 has reduced regrown native oxide 103, producing a reduction product 259 that includes oxygen 205 removed from regrown native oxide 103. With the oxygen 205 removed, semiconductor 102 reverts to its un-oxidized state. For example, if the reductant is hydrogen, the reaction may be expressed by $GeO_2 + 2 H_2 \rightarrow Ge + 2H_2O$. If the reductant is ammonia, the reaction may be expressed by $3GeO_2 + 4NH_3 \rightarrow 3Ge + 6H_2O + 2N_2$ Reduction product 259 (e.g., $H_2O$, $N_2$) is expelled through gaps 106, for example by applying heat 253 to substrate 101. This process produces a permeable ALD layer or stack with no native oxide underneath. In some cases, if the reduction product is sufficiently stable to retain the oxygen and prevent it from re-oxidizing the semiconductor, and if the properties of the reduction product do not adversely affect device performance, the reduction product may not need to be removed from the surface.

Reductant 259 may be, for example, gaseous ammonia ($NH_3$) or hydrogen ($H_2$). Alternatively, reductant 259 may include plasma-activated species (e.g., plasma-activated hydrogen), and the substrate temperature may be about 25 C or higher. Reductant 259 may diffuse through more than one permeable layer; for example, a high-k layer and a low-k layer. The thickness of the permeable layers may be between 2 and 40 Å. In some embodiments, reductant 259 only reacts with native oxide 103 or regrown native oxide 203 on semiconductor 102, not with the permeable layer(s) or any other material in the stack.

The ambient pressure in the chamber may range from about 0.1 to about 5 Torr. The treatment duration may be between about 1 minute and about 60 minutes. In some embodiments, the substrate may be heated to a temperature between about 300 and about 400 C.

FIG. 3 is a schematic diagram of an example ALD chamber. Inside ALD chamber 300, substrate 301 is held by a substrate holder 310. Substrate holder 310 may be configured with vacuum 312 (for example, a vacuum chuck to grip the substrate); motion 313 in any direction, which may include tilt and rotation; a magnetic field source 314; heater or temperature control 315; or sources of AC 316 or DC 317 bias voltage, or static electrical charge for an electrostatic chuck to hold the substrate (not shown). Chamber 300 also has gas inlets 321, 322, 323, 324 for precursors, buffer gases, and purge gases. Some of the inlets may feed through diffusers 325, 326. A remote plasma chamber 330 may generate reactive species that enter chamber 300 through input adapter 331. Measurement system 340 may monitor substrate 301 through measurement ports 342. The measurements from measurement system 340 may be collected by a monitoring system 350 and sent for analysis or storage to a data collection device such as computer 370. Substrate holder 310, gas inlets 321-324, diffusers 325-26, remote plasma chamber 330, plasma input adapter 331, exhausts 327-28, measurement system 340, and monitoring system 350 may jointly or individually be controlled by controllers such as computer 370.

To form ALD layers (such as high-k or low-k metal oxides or metal nitrides), the substrate 301 is prepared and positioned on substrate holder 310. Preparing substrate 301 may include removing pre-existing native oxides from a top semiconductor surface by any suitable method. Substrate 301 may be held on substrate holder 310 electrostatically, by vacuum, or by any other suitable means. Precursors for making the layers, as well as other process gases or species such as buffers or catalysts, may enter through plasma input adapter 331, undiffused gas inlets 321 and 322, or gas inlets 323 and 324 with diffusers 325 and 326. Precursors may be introduced into chamber 300 in "pulses," short periods of inflow followed by a delay to allow a portion of the precursor to adsorb on the surface of substrate 301, or the inflow may be continuous. To promote or regulate the adsorption of the deposited material from the precursors, substrate 301 may be heated or cooled 315, AC- or DC-biased 316 or 317, or subjected to a magnetic field 314 by substrate holder 310.

Exhausts 327 and 328 may equalize the pressure for continuously flowing precursors. Measurement equipment 340 may dynamically measure characteristics of the surface of substrate 301 so that monitoring equipment 350 may track the progress of precursor deposition. After each pulse or period of precursor inflow, chamber 300 may be purged by drawing any gaseous contents out through exhausts 327 and 328. In some embodiments, a purge gas may be routed through chamber 300. Purge gases are often inert gases such as nitrogen and argon, but other types of purge gases are sometimes used. The temperature, electric field, or magnetic field of substrate 301 may also be adjusted during the purge.

Like the precursors, the reductant for the reducing treatment may be generated in plasma chamber 330 and introduced into chamber 300 through plasma input adapter 331. Alternatively, a gaseous reductant may be introduced into chamber 300 through undiffused gas inlets 321 and 322, or gas inlets 323 and 324 with diffusers 325 and 326. The reductant may be introduced to the chamber as a pulse or as a soak. As used in the ALD art, a "soak" may refer to introducing a gas in the chamber, then closing off the inlets and exhausts for a predetermined time while the gas adsorbs or reacts with the substrate surface. It may also refer to a very long pulse (for instance, about 30 seconds to about 10 minutes). Exhausts 327 and 328 may regulate the chamber pressure. Substrate holder 310 may heat substrate 301 or apply an electric or magnetic field to promote or regulate the reduction reaction. The reduction products, any buffer gases or catalysts, and any unabsorbed reductant may then be purged through exhausts 327 and 328, optionally using additional purge gases introduced through gas inlets 321, 322, 323 or 324.

Figure 4:
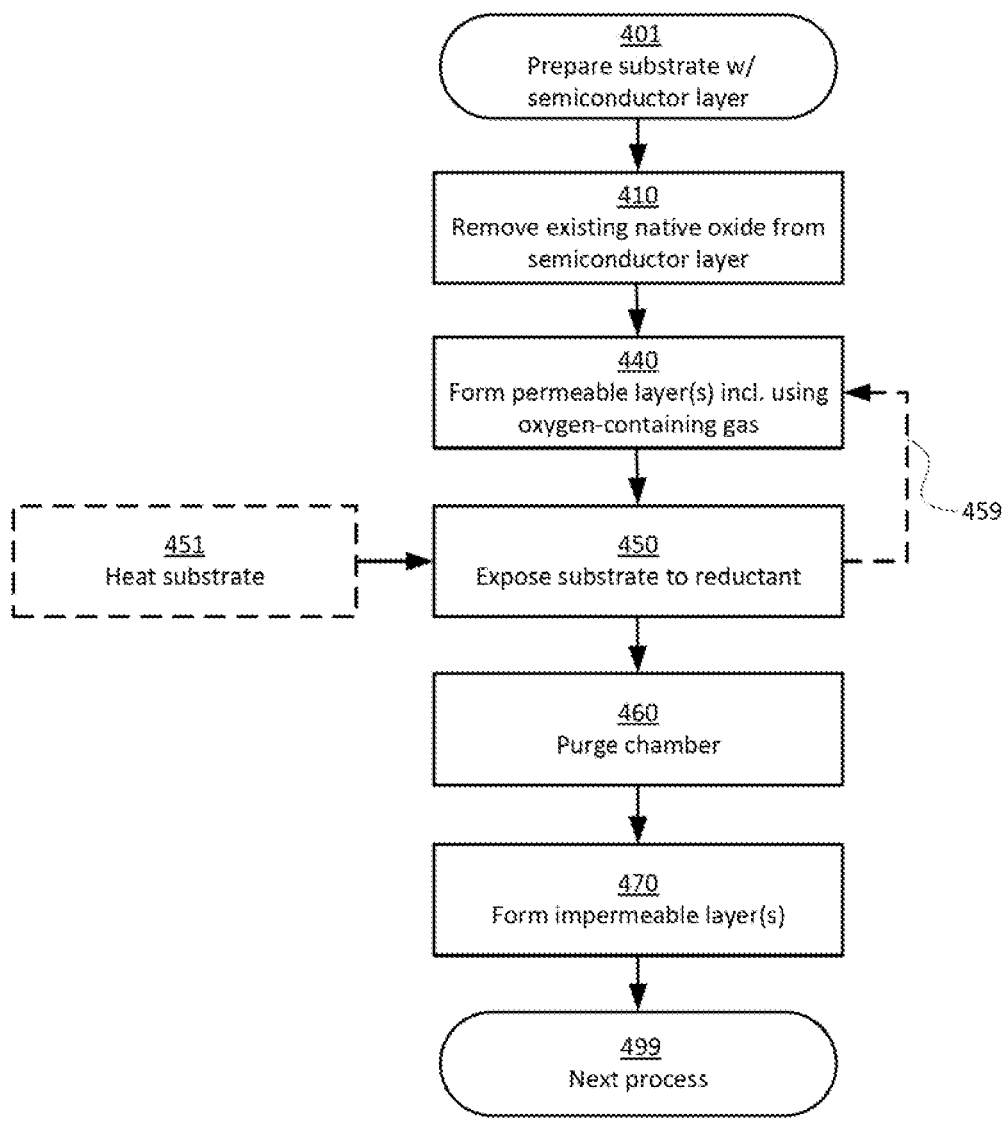
FIG. 4 is an example flowchart of a reducing treatment integrated with the formation of overlayers.

FIG. 4 is an example flowchart of a reducing treatment integrated with the formation of overlayers. The substrate with the top semiconductor layer is prepared 401 and positioned in the chamber. The top semiconductor layer may include germanium, silicon germanium, or indium gallium arsenide. Any existing native-oxide is removed 410. One or more permeable layers are formed 440 by a process that involves an oxidizing gas. The oxidizing gas may be an oxygen precursor, a different precursor with a ligand including oxygen, or an oxygen-containing process gas other than a precursor. The permeable layers may include high-k metal oxides, low-k metal oxides, or any other material that is permeable as deposited.

To eliminate or mitigate any native oxide regrowth that occurred during formation 440 of the permeable layers, the substrate is exposed 450 to a reductant. The reductant may be, for example, ammonia gas, hydrogen gas, or hydrogen plasma. The reductant reduces the regrown native oxide and the oxygen is removed. The reaction may be promoted or regulated by heating 451 the substrate. When a reduction cycle is complete (as estimated by its allowed duration or as concluded from the results of measurements), the chamber is again purged 460. At least one oxygen-impermeable layer is formed 470 to seal the permeable layers and the semiconductor surface from any further exposure to oxygen. For example, the oxygen-impermeable layer may be an electrode or a capacitor plate or a capping layer, and may include a metal or a metal nitride. After the oxygen-impermeable layer is fully formed 470, a next process 499 may begin.

Depending on the amount of expected native oxide regrowth, the reduction treatment 450 may be performed only once, just before the first oxygen-impermeable layer is formed 470. Alternatively, as indicated by dotted line arrow 459, the reduction treatment 450 may be repeated, and the repetitions may be interspersed between cycles or sets of cycles of permeable layer formation 440.

Even some highly impermeable materials such as titanium nitride (TiN) are somewhat permeable in thicknesses of a few monolayers. Therefore, the reduction treatment 450 may in some embodiments be performed directly after depositing a few initial, permeable monolayers of the material that will become the oxygen-impermeable layer as its thickness increases. For example, the first 1 to 10 monolayers may be permeable, depending on the composition and deposition parameters of the oxygen-impermeable layer.

In some processes, if a reductant is used in the deposition of the oxygen-impermeable layer (as high-temperature $NH_3$ may be used in ALD of TiN), the reduction may be a by-product of the impermeable-layer deposition, or of a modified version of the first few cycles. Such a modification may include, for example, lengthening the reductant pulse or lengthening a subsequent soak or pause, so that the reductant has sufficiently high concentration and sufficient time to diffuse through the permeable layer and reduce the underlying native oxide.

Figure 5:
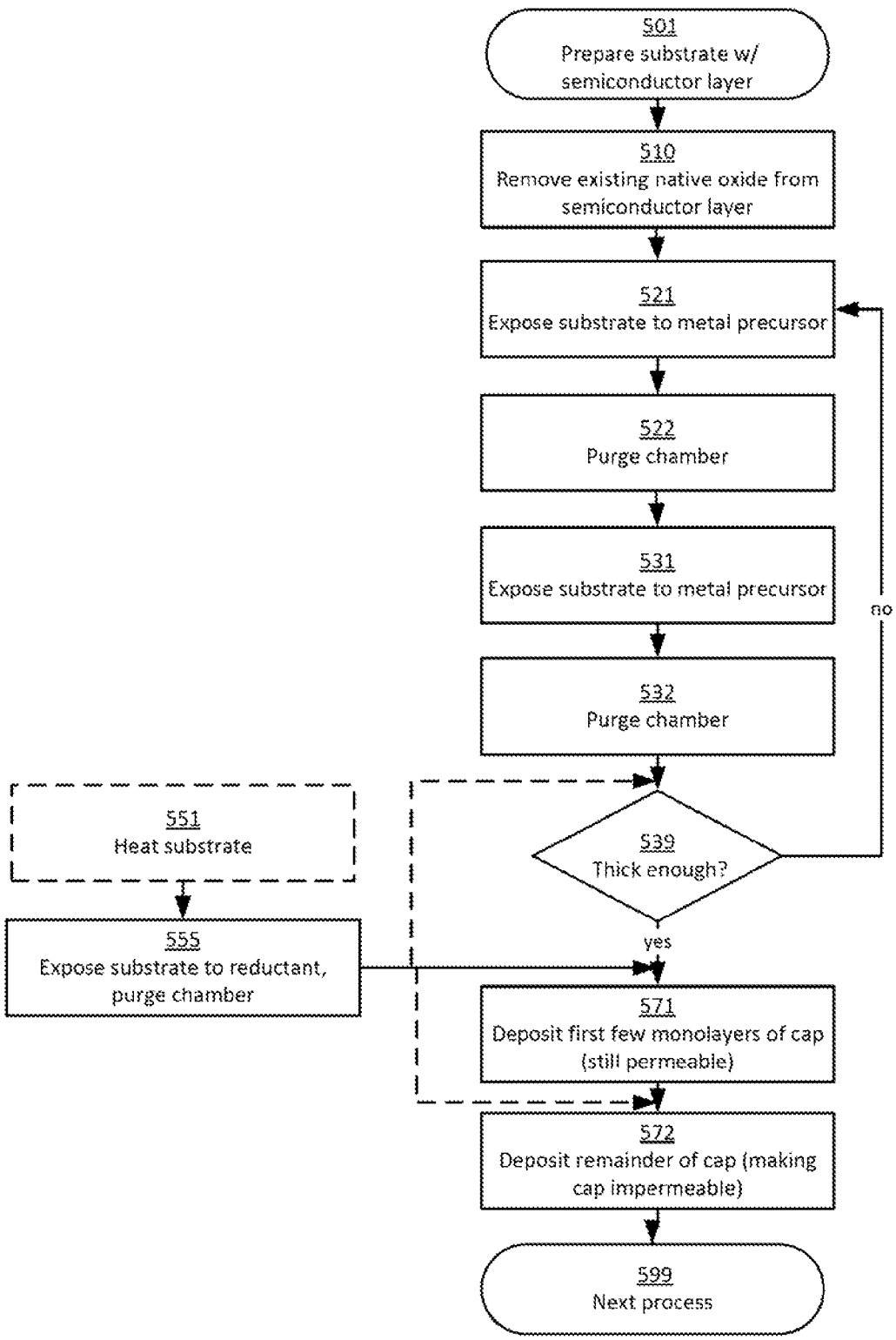
FIG. 5 is an example flowchart of a reducing treatment integrated with the formation of metal oxide layers and a capping layer.

FIG. 5 is an example flowchart of a reducing treatment integrated with the formation of metal oxide layers and a capping layer. To eliminate or mitigate any native oxide regrowth that occurred while forming the permeable metal oxide layers, the substrate is exposed 555 to a reductant; for example, ammonia gas, hydrogen gas, or hydrogen plasma. The reductant reduces the regrown native oxide and the oxygen is removed. The reaction may be promoted or regulated by heating 551 the substrate; for example, to between about 300 and about 400 C. When a reduction cycle is complete, the chamber is purged.

Depending on the amount of expected native oxide regrowth, the reduction treatment 555 may be performed only once, just before the oxygen-impermeable capping layer begins to be formed 571, or optionally just before enough capping-material monolayers are deposited to make the capping layer oxygen-impermeable 572. Alternatively, reduction treatment 555 may be repeated, and the repetitions may be interspersed between cycles or sets of cycles of permeable metal oxide layer formation 521-532.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method of removing an oxide from a surface of a substrate, the method comprising:
    forming a permeable layer over the surface;
    exposing the substrate to a reductant; and
    removing a reduction product from the surface;
    wherein the reductant diffuses through the permeable layer to react with oxygen in the oxide on the surface; and
    wherein the reduction product comprises the oxygen and at least part of the reductant.

2. The method of claim 1, wherein forming the permeable layer comprises exposing the substrate to an oxidant.

3. The method of claim 1, wherein the oxide is a result of oxidation of the surface by an oxidant diffused through the permeable layer.

4. The method of claim 1, further comprising removing a pre-existing oxide from the surface before the permeable layer is formed.

5. The method of claim 1, wherein at least one of the diffusing or the removing comprises heating the substrate.

6. The method of claim 1, further comprising heating the substrate to between about 300 C and about 400 C.

7. The method of claim 1, wherein the reductant comprises hydrogen.

8. The method of claim 1, wherein the reductant comprises hydrogen ($H_2$) or ammonia ($NH_3$).

9. The method of claim 1, wherein the reductant comprises a plasma-activated or plasma-generated species.

10. The method of claim 1, wherein the surface comprises germanium, silicon germanium, or indium gallium arsenide.

11. The method of claim 1, wherein the permeable layer comprises a metal oxide.

12. The method of claim 1, wherein the reductant does not react with the permeable layer.

13. The method of claim 1, wherein the forming, the exposing, the diffusing, or the removing is performed at an ambient pressure between about 0.1 Torr and about 5 Torr.

14. The method of claim 1, wherein the substrate is exposed to the reductant for a duration between about 1 minute and about 60 minutes.

15. The method of claim 1, wherein the permeable layer is between about 2 Å and about 40 Å thick.

16. The method of claim 1, wherein the exposing, the diffusing, and the removing are performed after the permeable layer is fully formed.

17. The method of claim 1, wherein the exposing, the diffusing, and the removing are performed between atomic layer deposition cycles of the forming of the permeable layer.

18. The method of claim 1, further comprising forming an oxygen-impermeable layer over the permeable layer.

19. The method of claim 18, wherein the substrate is exposed to the reductant as part of the forming of the oxygen-impermeable layer; and wherein the diffusing and removing are integrated into the forming of the oxygen-impermeable layer.

20. The method of claim 1, further comprising:
    forming an initial 1 to 10 permeable monolayers of an oxygen-impermeable layer over the permeable layer; and
    forming a remainder of the oxygen-impermeable layer;
    wherein the exposing, the diffusing, and the removing are performed between the forming of the initial 1 to 10 permeable monolayers and the forming of the remainder of the oxygen-impermeable layer.

* * * * *